United States Patent [19]

Greason

[11] Patent Number: 5,304,869
[45] Date of Patent: Apr. 19, 1994

[54] BICMOS DIGITAL AMPLIFIER

[75] Inventor: Jeffrey K. Greason, Portland, Oreg.

[73] Assignee: Intel Corporation, Santa Clara, Calif.

[21] Appl. No.: 870,568

[22] Filed: Apr. 17, 1992

[51] Int. Cl.$^5$ .................. H03K 19/08; H03F 3/16
[52] U.S. Cl. .................. 307/446; 307/455;
307/495; 330/253; 330/257; 330/300; 330/311
[58] Field of Search ............ 307/494, 495, 446, 455;
330/300, 311, 283, 257

[56] References Cited

U.S. PATENT DOCUMENTS

| | | | |
|---|---|---|---|
| 4,059,808 | 11/1977 | Sakamoto et al. | 330/257 |
| 4,194,136 | 3/1980 | Butler | 307/495 |
| 4,626,794 | 12/1986 | Sugimoto | 330/300 |
| 4,714,894 | 12/1987 | Gulczynski | 330/257 |
| 4,839,609 | 6/1989 | Hara et al. | 330/257 |
| 4,920,321 | 4/1990 | Armstrong | 330/311 |
| 4,992,681 | 2/1991 | Urakawa et al. | 307/451 |
| 5,068,551 | 11/1991 | Bosnyak | 307/455 |

FOREIGN PATENT DOCUMENTS 0451365 12/1990 European Pat. Off. .
3-220816 9/1991 Japan .................. 307/455
2209104 4/1989 United Kingdom .

OTHER PUBLICATIONS

Alvarez, Antonio, R., *BiCMOS Technology and Applications*, Kluwer Academic Publishers, 1989, pp. 206-219.

*Primary Examiner*—Edward P. Westin
*Assistant Examiner*—Jon Santamaur
*Attorney, Agent, or Firm*—Blakely Sokoloff Taylor & Zafman

[57] ABSTRACT

A BiCMOS circuit for amplifying the difference voltage between two input voltage signals. The BiCMOS circuit of the present invention includes two bipolar junction transistor which receive the two input voltage signals and each drive a cascode-connected PMOS device. The drains of the cascode-connected PMOS devices are coupled to the input and output of a current mirror, wherein the output of the current mirror is the output of the BiCMOS circuit.

12 Claims, 4 Drawing Sheets

BICMOS DIGITAL AMPLIFIER

FIELD OF THE INVENTION

The present invention generally relates to the field of integrated circuits which combine bipolar and complementary metal-oxide semiconductor (CMOS) devices on the same substrate; in particular, the present invention relates to the field of digital amplifiers.

BACKGROUND OF THE INVENTION

Recently, integrated digital logic circuits have been developed which combine bipolar and CMOS technologies. These circuits are referred to as BiCMOS circuits. The combination of bipolar and CMOS technologies is advantageous in that the beneficial features of each technology may be utilized in combination to provide an optimal circuit. For example, bipolar circuits have fast switching capabilities and typically drive larger capacitive loads. On the other hand, CMOS circuits have the advantage of low power consumption, rail-to-rail output capability, high density and a very high input impedance. Thus, the combination of these features allows the superior aspects of each to be exploited and combined to yield the optimal circuit performance.

One specific area of application of BiCMOS technology is providing compatibility between emitter-coupled logic (ECL) circuits and CMOS circuits. ECL circuits provide the fastest and most popular bipolar logic circuits available, but consume more power than CMOS or BiCMOS circuits. Other benefits of ECL circuitry include the implementation of circuitry having relatively small signal amplitude and temperature sensitivity, which are features that are not easily implemented with standard CMOS techniques.

BiCMOS is especially applicable interfacing CMOS circuitry to ECL circuitry since such an interface is not easily accomplished at high speeds using MOS techniques and high-speed operation usually requires the use of bipolar devices. Even though some prior art CMOS circuits exist which provide a direct interface to ECL circuits exist, these circuits have special requirements which must be met to accommodate the bipolar speeds. Simpler CMOS designs also have high noise margin and low power consumption.

In general, differential amplifiers in the prior art are used to interface between ECL circuits and CMOS logic. A differential amplifier receives a difference signal and converts it to a single-ended signal which other circuits utilize. Ideally, the output from the differential amplifier is entirely independent of the individual input signal levels. BiCMOS amplifier circuits have been created in the prior art. However, these amplifier circuits typically do not accommodate differential signals and do not amplify small signals to large signals very quickly. Moreover, these prior art BiCMOS amplifiers do not operate at low voltage levels.

Another drawback of conventional BiCMOS logic circuitry is its requirement of a high supply voltage during normal operation mode. Therefore, many prior art BiCMOS circuits do not operate as desired once the power supply drops from its normal operating range. This characteristic is a concern since the semiconductor industry is currently trying to lower the standard operating supply voltage from five to three volts in order to decrease the electric field to which the devices are subjected. Thus, what is needed is an integrated circuit combining CMOS and bipolar technologies to implement an interface between differential signal outputting devices and CMOS logic. Furthermore, such a circuit must be capable of operating at a reduced supply potential.

As will be seen, the present invention provides a BiCMOS digital amplifier. In addition, the BiCMOS digital amplifier of the present invention is a high-speed low-power amplifier which operates at a low voltage.

SUMMARY OF INVENTION

Accordingly, it is the object of the present invention to provide a BiCMOS digital amplifier circuit.

It is another object of the present invention to amplify differential signals very quickly.

It is another object of the present invention to amplify signals using low power.

It is another object of the present invention to amplify signals at low voltages.

It is yet another object of the present invention to provide an interface between differential signals and CMOS and BiCMOS circuitry.

A BiCMOS circuit for amplifying the difference voltage between two input voltage signals is described. The BiCMOS circuit of the present invention includes a differential current source generator and an output generator. The differential current source generator receives the two voltage signals and generates two currents respectively. The differential current source generator includes a first current source generator which generates two intermediate currents in response to input signals. The differential current source generator also includes a second current source generator for generating two currents in response to the respective intermediate currents. The output generator receives the two currents from the second current source generator and generates an output.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

DETAILED DESCRIPTION OF THE INVENTION

A BiCMOS differential signal amplifier and logic circuit is described. In the following description, numerous specific details are set forth, such as specific voltages, device types, sizes, etc., in order to provide a thorough understanding of the preferred embodiment of the present invention. It will be obvious to one skilled in the art that the present invention may be practiced without these specific details. Also, well-known circuits have been shown in block diagram form, rather than in detail, in order to avoid unnecessarily obscuring the present invention.

In addition, in describing the present invention, reference is made to signal names peculiar to the currently preferred embodiment. Reference to these specific signal names should not be construed as a limitation on the spirit or scope of the present invention.

DISCUSSION OF THE PRIOR ART

Before describing the present invention in detail, a basic understanding of the conventional logic circuits will aid in the appreciation of the details to follow.

Figure 1:
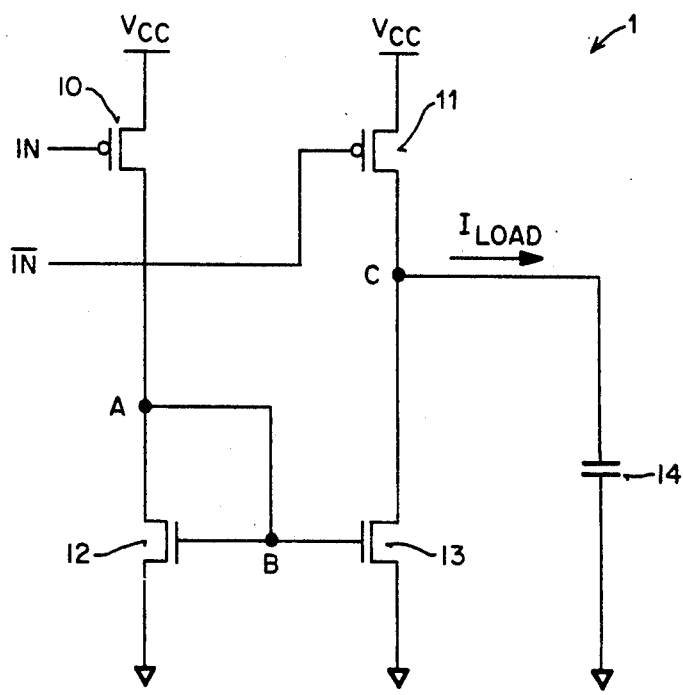
FIG. 1 is a circuit schematic of a prior art implementation of a differential signal amplifier using CMOS technology.

FIG. 1 illustrates a schematic of a prior art differential amplifier circuit 1. The circuit of FIG. 1 is described in connection with FIG. 6.6 in "BiCMOS technology and Applications," edited by Antonio R. Alvarez, Kluwer Academic Publishers, 1990. Differential amplifier circuit 1 includes p-channel MOS (PMOS) transistors 10 and 11 and n-channel MOS (NMOS) transistors 12 and 13, and a load capacitor 14. The sources of both PMOS transistors 10 and 11 are connected to the positive supply voltage ($V_{CC}$). The gates of PMOS transistors 10 and 11 are coupled to the differential input voltages labeled IN and $\overline{IN}$ respectively. The drains of both PMOS transistors 10 and 11 are coupled to nodes A and C respectively. The drain of NMOS transistors 12 and 13 are also coupled to nodes A and C respectively. Node A is coupled to node B, via short circuit A-B, such that the gates of NMOS transistors 12 and 13 are coupled to the drain of PMOS transistor 10. Furthermore, NMOS transistors 12 and 13 are matched, such that they source the same current to the load and, thereby, act as a current mirror. Load 14 which is the output of differential signal amplifier circuit 1 is coupled to the drain of PMOS transistor 11 at node C. The other terminal of capacitor 14 as well as the sources of both NMOS transistors 12 and 13 of the NMOS current mirror are coupled to $V_{SS}$ (e.g., ground).

Differential amplifier 1 receives differential voltage signals on the IN and $\overline{IN}$ inputs which are coupled to the gates of PMOS transistors 10 and 11. The differential voltage signals by definition consist of a low and high rail. To explain the operation of differential amplifier 1, consider first the effect of a high rail voltage being coupled to the IN input and the corresponding low rail being coupled to the $\overline{IN}$ input of the differential amplifier. The high rail applied to the IN input, and thus to the gate of PMOS transistor 10, causes PMOS transistor 10 to turn off. In this situation, the drain of PMOS transistor 10 does not source a current to NMOS device 12. The function of the current mirror configuration of NMOS devices 10 and 12 is to reflect the current from one side to the other side. Since PMOS device 10 does not source a current to NMOS device 12, no current is reflected to NMOS device 13. Effectively, NMOS device 13 does not sink any current at node C. However, the low rail of the differential voltage signal applied to the gate of PMOS device 11 causes PMOS device 11 to turn on, such that current is sourced through its drain. The current being sourced on the drain of PMOS device 11 is output at node C.

Differential amplifier 1 operates equally and opposite when the IN input receives a low rail of the differential input signal and the $\overline{IN}$ input receives the high rail of the differential voltage signals. In this situation, the low input voltage on the gate of PMOS device 10 causes PMOS device 10 to turn on, thereby sourcing current to NMOS transistor 12. The sourced current is reflected by the current mirror configuration of NMOS transistors 12 and 13. The reflected current essentially sinks the current at node C. The high rail differential voltage signal seen on the input $\overline{IN}$, and therefore seen on the gate of PMOS device 11, causes PMOS device 11 to turn off, such that PMOS device 11 does not source any current. Thus, since PMOS device 11 does not source a current and the reflected current essentially sinks current at node C, the output drops down.

In sum, the current to the load is equal to the current sourced by the drain of PMOS device 11 less the current sunk at node C, where the current sunk is equal to the current sourced by the drain of PMOS device 10. Hence, the current to the load is equal to the current through PMOS device 11 minus the current through PMOS device 10. The input signals IN and $\overline{IN}$ must be at the correct level in order to assure that the output of differential amplifier 1 (i.e., the current to the load) swings to both power rails. Differential amplifier requires large swings for IN and $\overline{IN}$, typically in the range of 1.5 to 2 volts below $V_{CC}$, in order to apply a sufficient gate to source voltage, $V_{GS}$, to PMOS devices 10 and 11 to attain high currents and high-speed operation.

Intrinsically, differential amplifier 1 of FIG. 1 is a slow circuit because the PMOS devices 10 and 11 have threshold voltages. In order for either PMOS device 10 or 11 to conduct current, its gate voltage IN or $\overline{IN}$ must be less than its threshold voltage. The threshold voltage for PMOS devices 10 and 11 is typically between 0.6–0.8 volts, such that by the time the signal is at its full logic level, the differential amplifier 1 is just turning on. Furthermore, the threshold voltage requirements limit the operation of differential amplifier 1 to the very low current regime (i.e., near the threshold voltage). Specifically, since PMOS devices 10 and 11 do not conduct any current unless its differential input voltage is below its threshold. If $V_{CC}$ is a high value, the swing of differential voltages on IN and $\overline{IN}$ loses the amount of the threshold voltage in the size of the swing. Thus, part of the voltage range is wasted.

Another prior art differential amplifier addresses the problem of increasing the speed by increasing the supply voltage.

Figure 2:
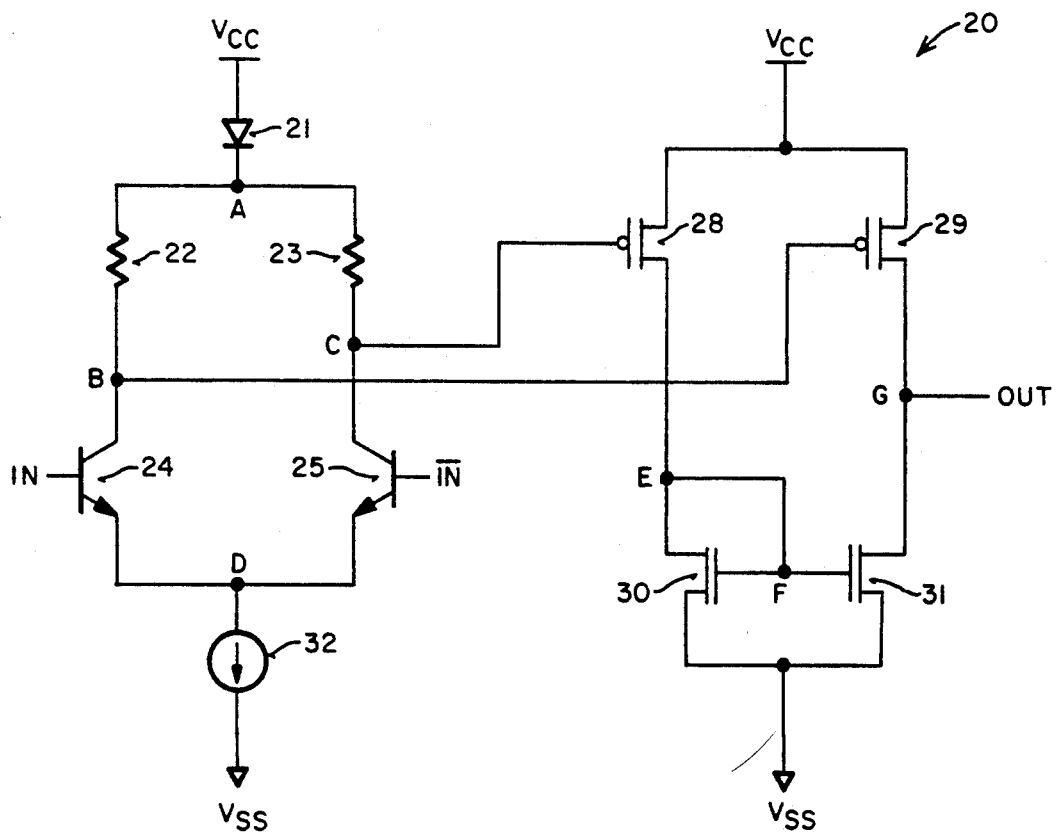
FIG. 2 is a circuit schematic of another prior art differential signal amplifier using BiCMOS technology.

The FIG. 2 describes a circuit schematic that allows for directly interfacing with ECL logic. Referring to FIG. 2, a positive supply voltage ($V_{CC}$) is coupled to the input of a diode 21. The output of diode 21 is coupled to node A. One terminal of resistors 22 and 23 are also coupled to node A. The other terminal of resistor 22 is coupled to node B. The other terminal of resistor 23 is coupled to node C. Also coupled to node B is the collector of bipolar transistor 24. The base of bipolar transistor 24 is coupled to the differential voltage signal IN. The emitter of bipolar transistor 24 coupled to node D. Node C is also coupled to the collector of bipolar transistor 25. The other differential voltage input signal $\overline{IN}$ is coupled to the base of bipolar transistor 25. The collector of bipolar transistor 25 is coupled to node D. A current source 32 is coupled between node D and $V_{SS}$ (e.g., ground).

Node B is also coupled to the gate of PMOS transistor 29. The source of PMOS transistor 29 is coupled to the positive supply voltage $V_{CC}$. The drain of PMOS transistor 29 is coupled to node G at the output. The drain of NMOS transistor 31 is also coupled to node G. Node C is coupled to the gate of PMOS transistor 28. The source of PMOS transistor 28 is coupled to the positive supply voltage $V_{CC}$, while the drain is coupled to node E. Node E is also coupled to the gates of NMOS transistors 30 and 31 at node F. The drain of NMOS transistor 30 is also coupled to node E. Both sources of NMOS transistors 30 and 31 are coupled to $V_{SS}$ (i.e., ground). NMOS transistors 30 and 31 are matched to form a current mirror.

PMOS devices 28 and 29 in conjunction with NMOS devices 30 and 31 constitute the same circuit architecture as seen in prior art FIG. 1. Thus, the differential amplifier of FIG. 2 adds an ECL stage onto the prior art circuit of FIG. 1. The added ECL stage comprises diode 21, resistors 22 and 23, bipolar transistors 24 and 25, and current source 32. The ECL stage acts as a pre-amplifier, whereby voltage gain is given for a small voltage swing of the input signal. Resistors 22 and 23 are low resistance components, such that the change in voltage across resistors 22 and 23 remains sufficiently low. Thus, the transistors 24 and 25 can be prevented from being driven into saturation.

To describe the operation of the ECL stage of differential amplifier 20, consider first the effect of the IN input signal being at the low voltage rail and the $\overline{IN}$ being coupled to the high rail of differential input voltage signal. In this case, since the input on the gate of bipolar transistors 24 is low, transistor 24 is off. Furthermore, since the potential on the gate of bipolar transistor 25 is high, bipolar transistor 25 is on and acts as an emitter follower. Thus, the emitter current flows through transistor 25, producing a voltage drop across resistor 23. The voltage drop across resistor 23 creates an output voltage at node C which puts a low input signal on PMOS transistor 28. Also since bipolar transistor 24 is off, the voltage at node B is high, thereby causing a high input on the gate of PMOS device 29. In this situation PMOS device 28 is turned on and PMOS device 29 is turned off. The effect of turning on PMOS device device 28 produces a drain current into the current mirror formed by NMOS transistors 30 and 31. The current formed by MOS transistor 30 is reflected on the drain of MOS transistor 31. Since PMOS device 29 is off, it does not source any current does not source any current on its drain. Therefore, the current at the drain of MOS device 31 acts to sink the current at node G. Therefore, the output is low.

Similarly, if the differential voltage signal at the IN input is high and the differential input signal on $\overline{IN}$ is low, bipolar devices 24 and 25 are on and off respectively. Bipolar transistor 24 is coupled as an emitter follower, such that a high input on its gate causes current to conduct through bipolar transistor 24. The current flowing through bipolar transistor 24, in conjunction with the current produced by current source 32, causes a voltage drop over resistor 22. The voltage drop over transistor 22 causes a low output voltage signal at node B, which is coupled to the gate of PMOS transistor 29. This causes PMOS transistor 29 to conduct and source current to node G. The low input signal on bipolar transistor 25 causes bipolar transistor 25 to be off, which in turn causes a high voltage at node C. The high voltage at node C causes PMOS device 28 to be off, such that it does not source any current. Since no current is sourced by PMOS device 28, the current mirror defined by NMOS devices 30 and 31 does not reflect any current on NMOS transistor 31. Therefore, there is no current to sink the current sourced by PMOS device 29. Thus, the output is high. In sum, the output is pulled up to $V_{CC}$ by PMOS device 29 or pulled down to $V_{SS}$ (i.e., ground) by NMOS device 31 depending on the complimentary input levels to differential amplifier 20.

The ECL stage effectively shifts the level of the signal, wherein it can shift the voltage level of the signal down due to the voltage drop over diode 21. In comparison to FIG. 1, for the same differential signal, differential amplifier 20 applies more $V_{GS}$ voltage on PMOS devices 28 and 29, at the expense of an extra stage and the reduced ability to operate at low supply voltages. Another stage of an emitter follower can be added to the input differential voltage signals, such that another voltage drop of one diode occurs to the input signals. The added diode drop causes the voltage level of the inputs to be lower. In this manner, resistors 22 and 23 can be made higher to allow the voltage to swing larger. In this manner, the level of the voltage signals can be brought down from the power supply voltage. However, more power is consumed. Even with the power consumption, however, the circuit of differential amplifier in FIG. 2 operates very fast.

Without the diode at the top of the differential amplifier, the voltage potential to turn on PMOS devices 28 and 29 is one voltage drop lower. However, the voltage on the PMOS devices 28 and 29 is typically less than one volt during the "off" state. Therefore, faster switching is achieved by adding a simple diode at the top of the differential amplifier. The problem with the differential amplifier of FIG. 2 is that many voltage drops are required to allow circuit to operate correctly. At high supply voltages, the circuit operates correctly. However, the multiple voltage drops limits the circuit operation at low voltage supply. Trying to obtain large voltage swings across the resistors 22 and 23 plus a large offset with diode 21 causes a large voltage on the top of the circuitry. For instance, if $V_{CC}$ is 5 volts where diode drop is approximately 0.7 volts, the voltage at node A is 4.3 volts. If a 1.5 voltage swing is desired access the resistors, the output of the low resistor is 2.8 volts. In order to keep the base-collector junctions of bipolar transistors 24 and 25 forward biased, the base voltage can be no higher than the collector voltage. Thus, the base voltage must be 2.8 volts. The emitter current source is at 2.1 volts or a diode drop down from the base voltage. The emitter voltage must be high enough to ensure the current source 32 still functions, especially where the $V_{bias}$ voltage is approximately 1 volt. Thus, at a high voltage such as $V_{CC}$ equal to 5 volts, the current in FIG. 2 functions properly. On the other hand, if $V_{CC}$ is only 3 volts, then there is only 2.3 volts at node A and only 0.8 volts at either of nodes B or C (where the voltage swing is 1.7 volts). Therefore, as the common emitter node D there is only 0.1 volts. The current source 32 cannot function correctly at such a low voltage on its terminal. Thus, as shown, the circuit shown in FIG. 2 does not operate at low voltage supplies.

Figure 3:
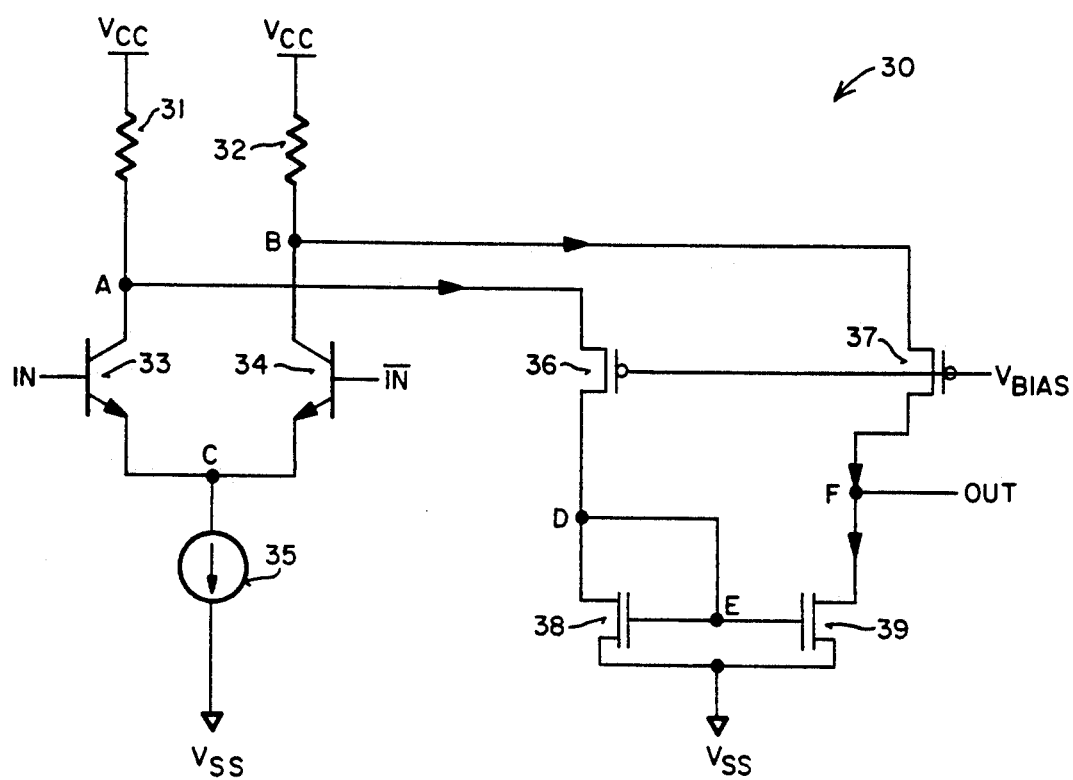
FIG. 3 is a circuit schematic of another prior art differential signal amplifier employing BiCMOS technology.

Another prior art circuit technique is shown in FIG. 3. Referring to FIG. 3, resistors 31 and 32 are coupled between a positive power supply voltage ($V_{CC}$) and nodes A and B respectively. Also coupled to nodes A and B are the collectors of bipolar transistors 32 and 34 respectively. The gates of bipolar transistors 33 and 34 are coupled to the IN and $\overline{\text{IN}}$ differential voltage signals respectively. The emitters of both bipolar transistors 33 and 34 are coupled to node C, which is also coupled to current source 35. The other end of the current source 35 is coupled to $V_{SS}$ (i.e., ground).

Nodes A and B are coupled to the sources of PMOS transistors 36 and 37. The gates of PMOS transistors 36 and 37 are coupled to a bias voltage ($V_{bias}$). The drain of PMOS device 36 is coupled to node D. Node D is coupled to node E, and, therefore, connected to the gates of NMOS transistors 38 and 39. Node D is also connected to the drain of NMOS transistor 38. The source of NMOS transistor 38 and the source of NMOS transistor 39 are coupled to $V_{SS}$ (i.e., ground). The drain of NMOS transistor 39 is coupled to node F, the output. The drain of PMOS transistor 37 is also coupled to node F. NMOS transistors 38 and 39 are coupled and matched to function as a current mirror. Coupled to this cascode configuration is the ECL stage, much like the ECL stage of FIG. 2.

Under the current configuration where the IN input or the $\overline{\text{IN}}$ input is high, it turns on its respective bipolar transistor, thereby producing a voltage drop across its respective collector resistor. In response, its respective PMOS transistor is not sourced current. The other bipolar transistor is turned off due to the low voltage on its gate, such that no current flows through its respective collector resistor. Therefore, the "off" bipolar transmitter sources current to its respective PMOS transistor.

When a current is not sourced through either resistors 31 or 32, a current is sourced to the source of PMOS transistor 36 or 37 respectively. The sourced current in conjunction with a low $V_{bias}$ voltage on the gate of the respective PMOS transistor causes the PMOS device to source a current on its drain. If PMOS transistor 36 sources a current on its drain, the current is reflected by the current mirror of NMOS transistors 38 and 39, such that the reflected current sinks the current at node F, thereby sinking the output and shifting the output downward. When PMOS device 37 sources a current at node F, PMOS device 36 does not sink current at node F and the output is driven up.

The problem with the circuit of FIG. 3 is that current source 35 is automatically divided between the two emitter follower branches, such that half the power is wasted in order to set up the circuit configuration to operate properly. Thus, the circuit configuration of FIG. 3 does not utilize power efficiently.

DISCUSSION OF THE PRESENT INVENTION

Figure 4:
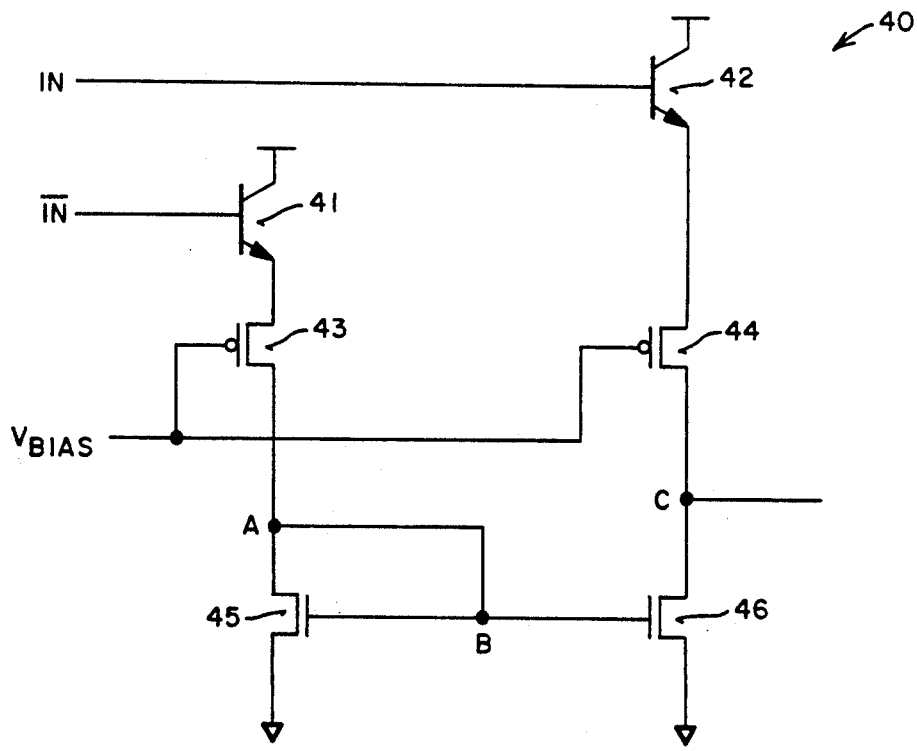
FIG. 4 is the currently preferred embodiment of the circuit schematic of the BiCMOS differential signal amplifier of the present invention.

FIG. 4 shows the currently preferred embodiment of the differential amplifier of the present invention. Referring to FIG. 4, differential amplifier 40 consists of two bipolar devices (BJT) 41 and 42, two PMOS devices 43 and 44 and two NMOS devices 45 and 46. BJTs 41 and 42 are configured as emitter followers, wherein the collector of both BJT 41 and 42 are coupled to a positive supply of voltage $V_{CC}$. The bases of each BJTs 41 and 42 are coupled to the differential signal input voltages $\overline{\text{IN}}$ and IN of differential amplifier 40 respectively.

Figure 5:
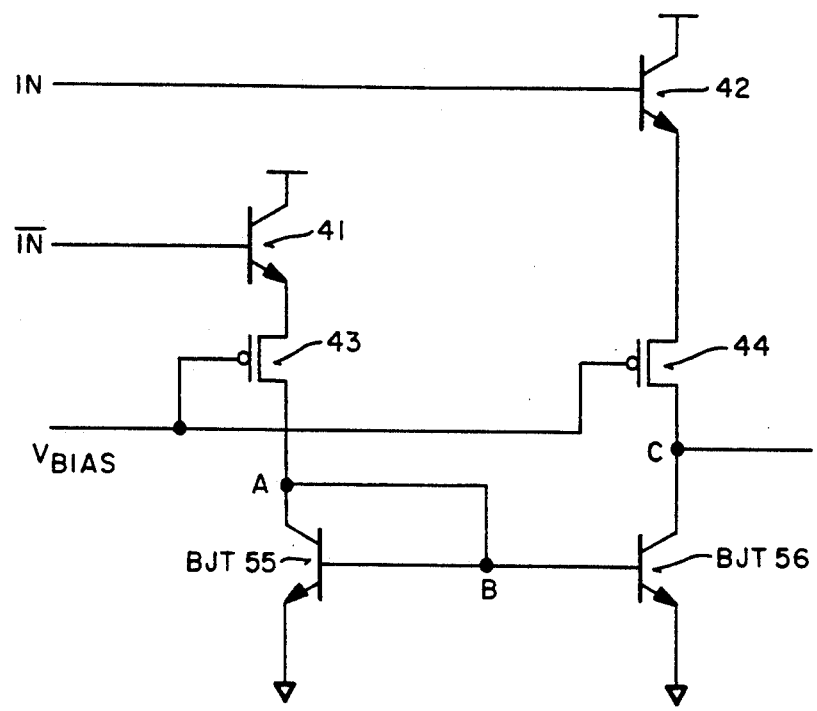
FIG. 5 is one embodiment of the circuit schematic of the differential signal amplifier of the present invention using bipolar junction transistors in the current mirror.
Figure 6:
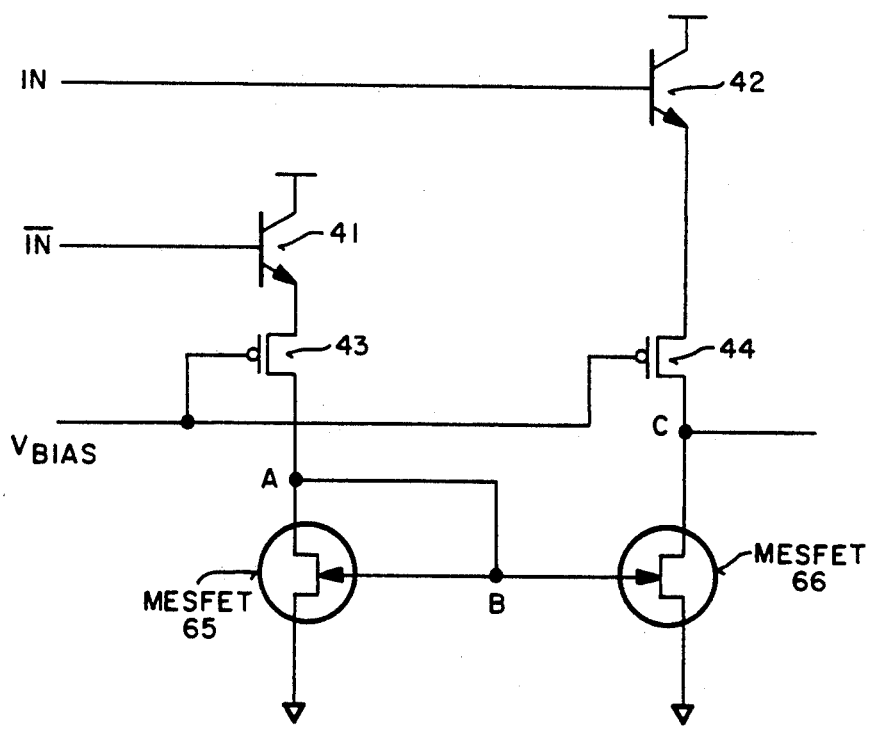
FIG. 6 is one embodiment of the circuit schematic of the differential signal amplifier of the present invention using metal semiconductor field-effect transistors (MESFETs) in the current mirror.

The emitters of BJTs 41 and 42 are coupled to the source of PMOS devices 43 and 44 such that each forms a cascoded connection with PMOS devices 43 and 44 respectively. The gates of both PMOS devices 43 and 44 are coupled to a bias voltage $V_{bias}$. The drains of PMOS transistors 43 and 44 are also coupled to nodes A and C respectively and, thus, are coupled to the drains of NMOS transistors 45 and 46. The sources of NMOS devices 45 and 46 are coupled to $V_{SS}$ (i.e., ground). Node A is also coupled to the gates of both NMOS devices 45 and 46 via short circuit A-B, such that NMOS devices 45 and 46 form a current mirror. In other embodiments, devices 45 and 46 can be BJTs and metal semi-conductor field-effect transistors (MESFETs) as shown in FIG. 5 and FIG. 6 respectively.

Figure 7:
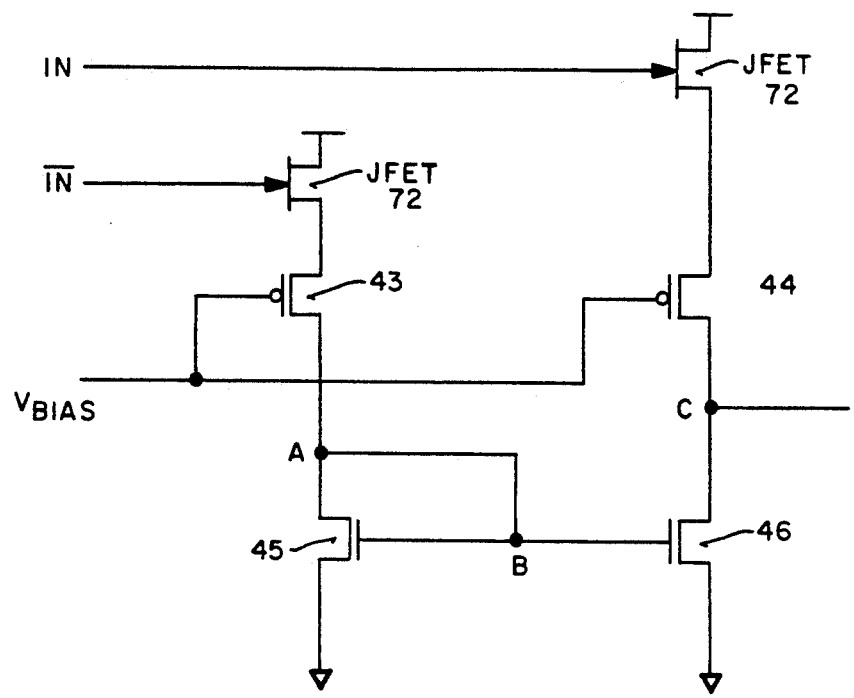
FIG. 7 is one embodiment of the circuit schematic of the differential amplifier of the present invention using junction field-effect transistors (JFETs) as the emitter followers.
Figure 8:
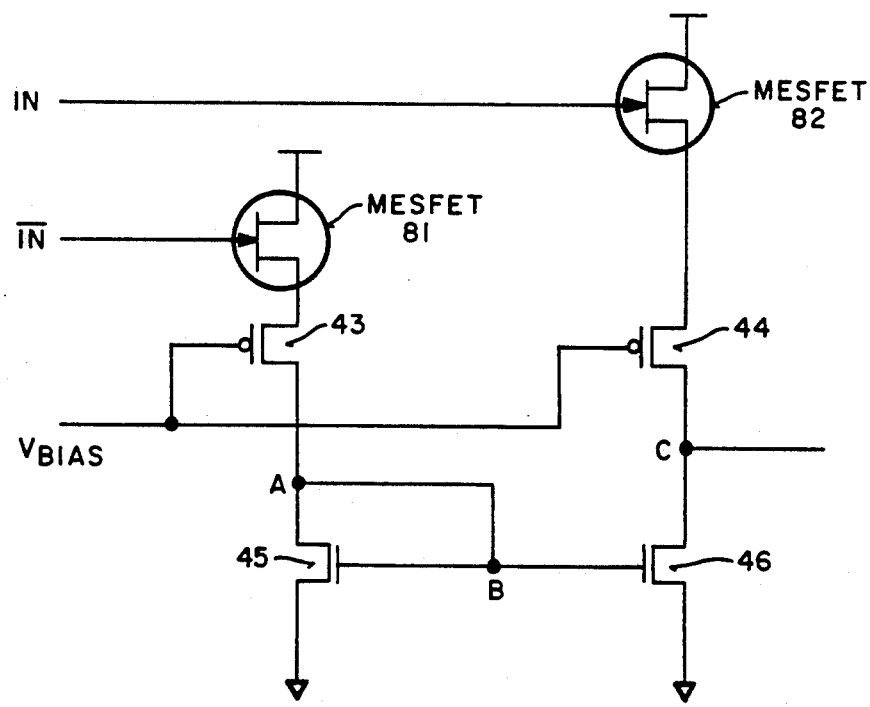
FIG. 8 is one embodiment of the circuit schematic of the differential amplifier of the present invention using MESFETs as the emitter followers.

The essential element of the present invention is the use of BJTs 41 and 42 as emitter followers to drive the cascode-connected PMOS devices 43 and 44 respectively. The cascoded connection of PMOS devices 43 and 44 allows large gate to source voltages, $V_{GS}$, to be applied with the differential input voltages being close to $V_{CC}$, since the input voltages, shifted down by a voltage drop over BJTs 41 and 42, are applied to the source, rather than the gate of PMOS devices 43 and 44. The BJTs 41 and 42 must act as good emitter followers such that they produce a better output resistance (i.e., impedance) than PMOS devices 43 and 44. In another embodiment, devices 41 and 42 are either a junction field effect transistor (JFET) or a metal semi-conductor field effect transistor (MESFET) as shown in FIG. 7 and FIG. 8 respectively. MOS devices would not operate correctly in place of BJTs 41 and 42 because the MOS devices would appear, in conjunction with PMOS devices 43 and 44, as series resistors, such that the 0.8 volt voltage drop between the differential input signals would be shared over both serially connected devices. Thus, BJTs 41 and 42 allow the input signals to shift the sources of PMOS devices 43 and 44 up and down.

The use of the emitter followers between the inputs of the cascoded sources provides a large current gain, which creates a high impedance input. These high impedance inputs allow normal, low current drive signals to drive amplifier 40. The cascoded connection allows control of the bias point of PMOS devices 43 and 44 with the $V_{bias}$ voltage, independent of the choice of the input level of the differential signals, which can be up to $V_{CC}$. Since the desired $V_{GS}$ of the PMOS device 43 and 44 is in the range of 1.5 to 2 volts, high-speed operation can be obtained with voltage supplies as low as 2.3 to 2.8 volts.

To fully understand the operation of the currently preferred embodiment of the present invention as shown in FIG. 4, consider first where the differential input signals on IN and $\overline{\text{IN}}$ are high and low respectively. Typically, the difference between between the signals is approximately 0.8 volts. Thus, BJTs 41 and 42 acting as emitter followers produce output emitter voltages of approximately $V_{CC}$ minus the voltage drop over BJT 41 and equal to $V_{CC}$ minus 0.8 volts minus the voltage drop over the BJT 42 respectively. The voltage drop over a BJT is approximately 0.6 volts and depends on the current through the BJT and the temperature on the BJT. BJTs 41 and 42 act as emitter followers to force a high input to produce a high output and a low input to produce a low output. In this configuration, BJTs 41 and 42 act to duplicate the input voltage on the base on the source of PMOS devices 43 and 44, with the exception of an additional voltage drop from the BJT itself. Since PMOS devices 43 and 44 have the same gate bias voltage $V_{bias}$ and receive one driver having 0.8 volts less source voltage than the other, the bias voltage $V_{bias}$ can be chosen such that one of the PMOS devices 43 or 44 operates at its threshold. In this situation, at the threshold voltage, one of the PMOS devices would not conduct and the other would have 0.8 volts of the gate to source voltage in excess of the threshold, for high current conduction.

The sourcing of PMOS devices 43 and 44 causes PMOS devices 43 and 44 to source currents to nodes A and C respectively. Any current which is sourced in node A is reflected into the drain of NMOS device 46 due to the current mirror configuration of NMOS devices 45 and 46. Thus, any current sourced from PMOS device 43 sinks current at node C. Therefore, the output current at node C is the sum of a current sourced by PMOS device 44 and any current sunk due to the sourcing of current by PMOS device 43.

In the currently preferred embodiment, the bias voltage $V_{bias}$ coupled to the gates of PMOS devices 43 and 44 is chosen such that the voltage differential between PMOS devices 43 and 44 when PMOS devices 43 and 44 are "on" and "off" respectively and vice versa, is large, yet the "off" device is at its threshold voltage. That is, the "off" device is all the way "off", but not off anymore than it needs to be. In this manner, the "on" device has a large $V_{GS}$. In actuality, $V_{bias}$ can be as low as $V_{SS}$.

Using the cascoding allows the gate to source voltage $V_{GS}$ as applied between the gate to source junction of PMOS devices 43 and 44, to be large such that the differential voltage inputs are close to $V_{CC}$. In the prior art circuits, the signals were coupled to the gates. Using this configuration, it is difficult to obtain a high $V_{GS}$ because the signal is close to $V_{CC}$ and the source was limited to being at the most $V_{CC}$. Using cascoding, the signal is on the source and the $V_{GS}$ can be made very large simply by lowering the bias voltage $V_{bias}$.

The present invention allows for amplification of digital differential signals very quickly. The intrinsic speed limit of the present invention is determined by the amount of power the present invention burns versus the speed. Thus, steering or sinking more current through node C increases the speed, yet burns more power. The present invention is also very power efficient since only one of the currents down the two cascoded paths controls the output. The present invention also works well at low supply voltages because the set up bias voltage $V_{bias}$ is in the "opposite" direction of the input voltages. Thus, by having the input differential voltages IN and IN high and the bias voltage on the PMOS devices 43 and 44 low, the present invention creates a large $V_{GS}$ across the devices without being limited by the supply voltage.

The present invention enables integrating small-swing logic, such as ECL or CML circuit logic, to CMOS or BiCMOS circuitry, even in a three volt environment. This is of particular importance because ECL technology, although very fast, utilizes a considerable amount of power. CMOS devices use less power and are much slower. Thus, the present invention acts as an interface to convert the level between the two technologies.

The present invention also has foreseeable applications in high-speed memories. Particularly, when a memory access is made in which the memory cells comprise CMOS devices and the input/output (I/O) buffers are ECL devices. In this manner, each ECL acts as an input buffer into the random access memory. The ECL circuits are utilized because the ECL interface is significantly faster than other standard digital logic. Thus, the present invention allows the ECL input/output logic to interface with the CMOS memory.

Whereas many alterations and modifications in the present invention will no doubt become apparent to a person of ordinary skill in the art after having read the foregoing description, it is understood that the particular embodiment shown and described by illustration is in no way intended to be limiting. Therefore, reference to the details of the preferred embodiments are not intended to limit the scope of the claims which themselves recite only those features regarded as essential to the invention.

Thus, the high-speed low-power BiMOS digital amplifier with low-voltage operation has been described.

I claim:

1. A BiCMOS circuit architecture for amplifying the difference voltage between first and second input signals having an input level;
   first and second emitter followers coupled to an operating potential, wherein the bases of said first and second transistors are connected to the first and second input signals respectively, wherein a current gain is provided, such that the circuit operates at low voltages, wherein said first and second emitter followers generate first and second currents respectively in response to said first and second input signals respectively; and
   third and fourth transistors cascode connected to said first and second transistors to receive the first and second currents, wherein said third and fourth transistors are biased by a first potential independent of the input level of the first and second input signals, and wherein the gate-to-source voltage over each of said third and fourth transistors is increased by lowering the first potential, said third and fourth transistors producing third and fourth currents respectively in response to the first and second currents;
   current source means coupled to said third and fourth transistors for providing an output in response to said third and fourth currents, wherein said current source means includes fifth and sixth transistors coupled as a current mirror having an input and an output, wherein the drain and the gate of said fifth transistor and the gate of said sixth transistor are connected directly to said input of said current mirror without any intervening elements and said sources of said fifth and sixth transistors coupled to a first potential, and further wherein said current mirror is coupled to said third and fourth p-channel MOS transistors and said drain of said sixth transistor is coupled to said output, wherein the output is the fourth current less the third current.

2. The circuit architecture defined in claim 1 wherein said current source means includes a current mirror.

3. The circuit architecture defined in claim 2 wherein said third and fourth transistors comprise p-channel MOS transistors.

4. The circuit defined in claim 1 wherein said first and second emitter of followers comprise first and second bipolar transistors.

5. A BiCMOS circuit architecture for amplifying the difference voltage between first and second input signals comprising:

first and second bipolar junction transistors, each of said first and second transistors configured as an emitter follower, wherein the bases of said first and second transistors are coupled to said first and second input signals respectively, said first and second transistors generating first and second currents in response to said first and second input signals respectively;

third and fourth p-channel MOS transistors cascode connected to said first and second transistors respectively, said third and fourth transistors generating third and fourth currents respectively in response to said first and second currents respectively; and fifth and sixth transistors coupled as a current mirror having an input and an output, wherein the drain and the gate of said fifth transistor and the gate of said sixth transistor are connected directly to said input of said current mirror without any intervening elements and said drain of said sixth transistor is coupled to said output, said sources of said fifth and sixth transistors coupled to a first potential, said current mirror being coupled to said third and fourth p-channel MOS transistors, such that said current mirror generates a current on the drain of said sixth transistor which is equal to said third current and the current at said output is the sum of said third and fourth currents.

6. A BiCMOS circuit architecture for amplifying the difference voltage between first and second input signals comprising:

first and second metal semiconductor field effect transistors (MESFET), each of said first and second transistors configured as an emitter follower, wherein the bases of said first and second transistors are coupled to said first and second input signals respectively, said first and second transistors generating first and second currents in response to said first and second input signals respectively;

third and fourth p-channel MOS transistors cascode connected to said first and second transistors respectively, said third and fourth transistors generating third and fourth currents respectively in response to said first and second currents respectively; and fifth and sixth transistors coupled as a current mirror having an input and an output, wherein the drain and the gate of said fifth transistor and the gate of said sixth transistor are connected directly to said input of said current mirror without any intervening elements and said drain of said sixth transistor is coupled to said output, said sources of said fifth and sixth transistors coupled to a first potential, said current mirror being coupled to said third and fourth p-channel MOS transistors, such that said current mirror generates a current on the drain of said sixth transistor which is equal to said third current and the current at said output is the sum of said third and fourth currents.

7. A BiCMOS circuit architecture for amplifying the difference voltage between first and second input signals comprising:

first and second junction field effect transistors (JFET), each of said first and second transistors configured as an emitter follower, wherein the bases of said first and second transistors are coupled to said first and second input signals respectively, said first and second transistors generating first and second currents in response to said first and second input signals respectively;

third and fourth p-channel MOS transistors cascode connected to said first and second transistors respectively, said third and fourth transistors generating third and fourth currents respectively in response to said first and second currents respectively; and fifth and sixth transistors coupled as a current mirror having an input and an output, wherein the drain and the gate of said fifth transistor and the gate of said sixth transistor are connected directly to said input of said current mirror without any intervening elements and said drain of said sixth transistor is coupled to said output, said sources of said fifth and sixth transistors coupled to a first potential, said current mirror being coupled to said third and fourth p-channel MOS transistors, such that said current mirror generates a current on the drain of said sixth transistor which is equal to said third current and the current at said output is the sum of said third and fourth currents.

8. The circuit architecture defined in claim 5 wherein each of said fifth and sixth transistors comprises a MESFET.

9. The circuit architecture defined in claim 5 wherein each of said fifth and sixth transistors comprises an n-channel MOS transistor.

10. The circuit architecture defined in claim 5 wherein each of said fifth and sixth transistors comprises an NPN device.

11. A BiCMOS circuit architecture for amplifying the difference voltage between first and second input signals comprising:

first and second bipolar transistors, each of said first and second bipolar transistors configured as an emitter follower, wherein the bases of said first and second transistors are coupled to said first and second input signals respectively and the collectors are coupled to a first potential, said first and second transistors generating first and second currents in response to said first and second input signals respectively and said first potential;

third and fourth p-channel MOS transistors cascode connected to said first and second transistors respectively, said third and fourth transistors generating third and fourth currents respectively in response to said first and second currents respectively; and fifth and sixth n-channel MOS transistors, said fifth and sixth transistors coupled as a current mirror having an input and an output, wherein the drain and the gate of said fifth transistor and the gate of said sixth transistor are connected directly to said input of said current mirror without any intervening elements and said drain of said sixth transistor is coupled to said output, said sources of said fifth and sixth transistors coupled to a second potential, said current mirror being coupled to said third and fourth transistors, such that said current mirror generates a current on the drain of said sixth transistor which is equal to said third current and the current at said output is the sum of said third and fourth currents.

12. The circuit defined in claim 11 wherein said output is CMOS compatible.

* * * * *